United States Patent [19]
Hara et al.

[11] Patent Number: 5,331,583
[45] Date of Patent: Jul. 19, 1994

[54] RUNNING-AVERAGE/DECIMATION FILTER FOR AN OVERSAMPLING A/D CONVERTER

[75] Inventors: Hirotaka Hara, Kodaira; Yukihito Ishihara, Ohme; Masaru Kokubo, Hachiohji, all of Japan

[73] Assignee: Hitachi, Ltd., Tokyo, Japan

[21] Appl. No.: 76,855

[22] Filed: Jun. 15, 1993

[30] Foreign Application Priority Data

Jun. 19, 1992 [JP] Japan .................. 4-186205

[51] Int. Cl.$^5$ .................................. G06F 15/31
[52] U.S. Cl. .................. 364/724.01; 364/724.1; 341/166
[58] Field of Search ............. 364/724.01, 724.1; 341/166, 167, 155

[56] References Cited

U.S. PATENT DOCUMENTS 4,983,975  1/1991  Sugino et al. .................. 341/166

OTHER PUBLICATIONS

1985 IEEE International Solid-State Circuits Conference, "MOS ADC-Filter Combination That Does Not Require Precision Analog Components", Hauser et al., pp. 80–81.
1986 IEEE International Solid-State Circuits Conference, "A Voiceband 15b Interpolative Converter Chip Set", Yamakida et al., pp. 180–181.
IEEE Journal of Solid-State Circuits, vol. SC-21, No. 6, Dec. 1986, "A 12-bit Sigma-Delta Analog-to-Analog Converter with a 15-MHz Clock Rate", Koch et al., pp. 1003–1010.

Primary Examiner—Tan V. Mai
Attorney, Agent, or Firm—Fay, Sharpe, Beall, Fagan, Minnich & McKee

[57] ABSTRACT

A filter processing unit 2 receives the output of an oversampling-type analog/digital (A/D) converter circuit 1. Predetermined information is acquired by a compensation circuit 3-1 with predetermined timing from the filter processing unit 2 in the course of processing for producing a filter output for a predetermined integration-phase state and the predetermined information is fed back to the filter processing unit 2 as compensation information representing a difference in magnitude between a filter output with an integration phase lagging behind or leading ahead of the predetermined integration-phase state and a filter output with an unchanged integration phase in order to produce a controllable-phase filter output DMout. The timing for the acquisition of the compensation information by the compensation circuit 3-1 is controlled by a control circuit 7-1.

16 Claims, 8 Drawing Sheets

RUNNING-AVERAGE/DECIMATION FILTER FOR AN OVERSAMPLING A/D CONVERTER

BACKGROUND OF THE INVENTION

From a product point of view, the present invention relates to a running-average filter, also referred to hereafter as a decimation filter, which is connected to the output of an oversampling-type A/D converter circuit. From a technological point of view, on the other hand, the present invention relates to an effective technique suitable for a communication/transmission apparatus such as an echo-canceller transmission apparatus.

An oversampling-type A/D converter circuit outputs one to several-bit data as a conversion result which has a relatively low accuracy. However, an extremely high number of pieces of output data can be obtained by increasing the sampling clock frequency to a value typically as high as 5.12 MHz. In addition, by applying a running-average operation on data output by such an oversampling-type A/D converter circuit, a conversion result can be derived from the output data with a high degree of accuracy. In the running-average operation, certain weights are applied according to impulse responses and an average value or a root mean square value is computed. The running-average operation can be executed by means of a decimation filter. When the oversampling-type A/D converter and the decimation filter are employed in a system, in which the output phase of its digital data is variable, such as a communication/transmission apparatus, for example, the signal with a variable output phase is supplied to a DPLL (Digital Phase Locked Loop) circuit. An example of a signal with a variable output phase is a waveform-equalized signal output by the conventional decimation filter. The DPLL circuit synchronizes the phase of a sampling clock signal with the waveform-equalized signal having a variable output phase. In this way, the decimation filter can immediately output correct values in accordance with the phase variations. The fact that the decimation filter can immediately output correct values in accordance with the phase variations is desirable for obtaining a stable operation or good data transmission characteristics out off the entire system in which the digital data has a variable output phase.

An example of a decimation filter, which takes this desirable capability into consideration, is disclosed in the U.S. Pat. No. 4,983,975 dated Jan. 8, 1991. The decimation filter typically comprises three types of filters FIRA, FIRB and FIRC connected to the output of an oversampling-type A/D converter circuit 1 for converting an analog signal Ain into digital data as shown in FIG. 9. The circuits of the filters FIRA, FIRB and FIRC are identical with one another but each supplied with a clock signal having a frequency different from each other. The clock signals are supplied by a control circuit CTL denoted by reference numeral 7-3 so that the filters FIRA, FIRB and FIRC typically calculate leading-phase, unchanged-phase and lagging-phase outputs of the oversampling-type A/D converter circuit 1. The generation of the clock signals by the control circuit CTL is based on a sampling clock signal $\phi$os. Receiving a leading-phase signal Lead and a lagging-phase signal Lag from the DPPL circuit, the control circuit CTL further provides a select circuit SET denoted by reference numeral 13 with a command signal for selecting one of signals output by the filters FIRA, FIRB and FIRC. Receiving the command signal from the control circuit CTL, the select circuit SEL forwards one of the signals output by the filters FIRA, FIRB and FIRC. A register REG denoted by reference numeral 6 latches a signal output by the select circuit SEL, outputting digital data synchronized with data-processing timing of a digital circuit at a later stage. With this decimation filter, the integration phase of the decimation filter can be controlled in $\phi$os-period units, where Ous is the sampling clock signal as cited above. As a result, the decimation filter functions correctly even for a system in which the output phase of its digital data varies.

In the case of the conventional technology described above, however, three filters each having a circuit configuration identical with each other are required in the filter unit which determines the circuit size of the decimation filter. The variable-output-phase decimation filter is inevitably about three times larger than a decimation filter applied to a system in which the output phase of its digital data is fixed.

SUMMARY OF THE INVENTION

It is an object of the present invention to provide a controllable-phase decimation filter for a system in which the output phase of its digital data varies without bringing thereon a circuit size excessively larger than that of decimation filter for a fixed-phase system. It is another object of the present invention to provide an A/D converter displaying excellent characteristics even if it is applied to a system in which the output phase of its digital data varies.

The objects described above and other objects of the present invention as well as new features thereof will become apparent from the following detailed description of the specification with reference to accompanying diagrams.

An outline of a representative invention disclosed in this specification is briefly described as follows. A decimation filter according to the present invention is, in general, connected to the output of an oversampling-type A/D converter circuit 1. The decimation filter comprises:

a filter processing unit 2 for processing digital data output by the oversampling-type A/D converter circuit 1 in a predetermined integration-phase state and outputting a processing result as a filter output signal;

a compensation circuit 3-1 for acquiring compensation information representing a difference in magnitude between a filter output with an integration phase lagging behind or leading ahead of the predetermined integration-phase state and a filter output with an unchanged integration phase from a predetermined node of the filter processing unit 2 with predetermined timing and supplying the acquired compensation information to another predetermined node of the filter processing unit 2; and a control circuit 7-1 for receiving external phase-change information indicating a leading-phase state or a lagging-phase state and, in accordance with the phase states, generating a timing signal for determining the timing with which the compensation circuit 3-1 acquires the compensation information.

In the decimation filter provided by the present invention as described above, predetermined information is acquired by the compensation circuit with the predetermined timing from the predetermined node of the filter processing unit in the course of a process for producing a filter output for a predetermined integration-phase state and the predetermined information is fed back to the other predetermined node of the filter processing unit as compensation information representing a difference in magnitude between a filter output with an integration phase lagging behind or leading ahead of the predetermined integration-phase state and a filter output with an unchanged integration phase in order to produce a controlled-phase filter output. When it is not necessary to change the integration phase, the output of the compensation circuit is substantially cleared to produce a filter output for the predetermined integration-phase state or an uncontrolled-phase filter output. With this configuration, the phase of the filter output can thus be controlled by a single filter processing unit without the necessity to incorporate a plurality of circuits each identical to the filter processing unit. In addition, since the compensation circuit acquires the compensation information from the filter processing unit, a very fine phase control can be ensured with ease by using the period of a reference clock signal for filter processing in the filter processing unit as a smallest control unit. Typically, a sampling clock signal of the oversampling-type A/D converter circuit 1 is adopted as the reference clock signal of the filter processing.

DETAILED DESCRIPTION OF THE INVENTION

Figure 1:
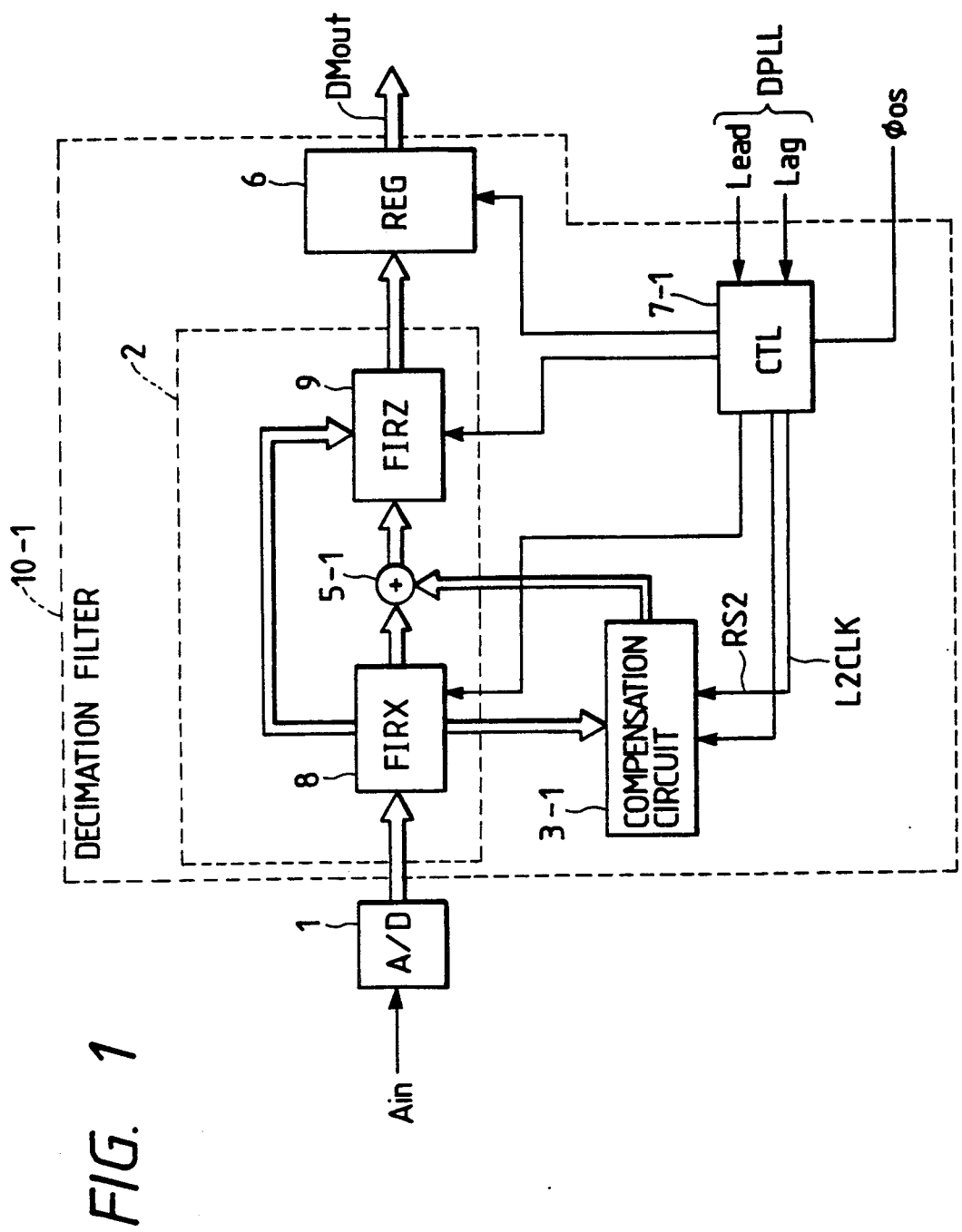
FIG. 1 is a block diagram of an embodiment implementing a decimation filter in accordance with the present invention.

FIG. 1 is a block diagram of an embodiment implementing a decimation filter in accordance with the present invention. A decimation filter 10-1 shown in the figure is employed mainly in a system in which its output phase varies. As shown in the figure, the decimation filter 10-1 is connected to the output of an oversampling-type A/D converter circuit 1 which is also referred to hereafter simply as an A/D converter circuit. Notation $\phi$os denotes a sampling clock signal for determining sampling periods of the A/D converter circuit 1. In the case of this embodiment, the sampling clock signal $\phi$os has a frequency of, for example, 5.12 MHz.

Figure 8:
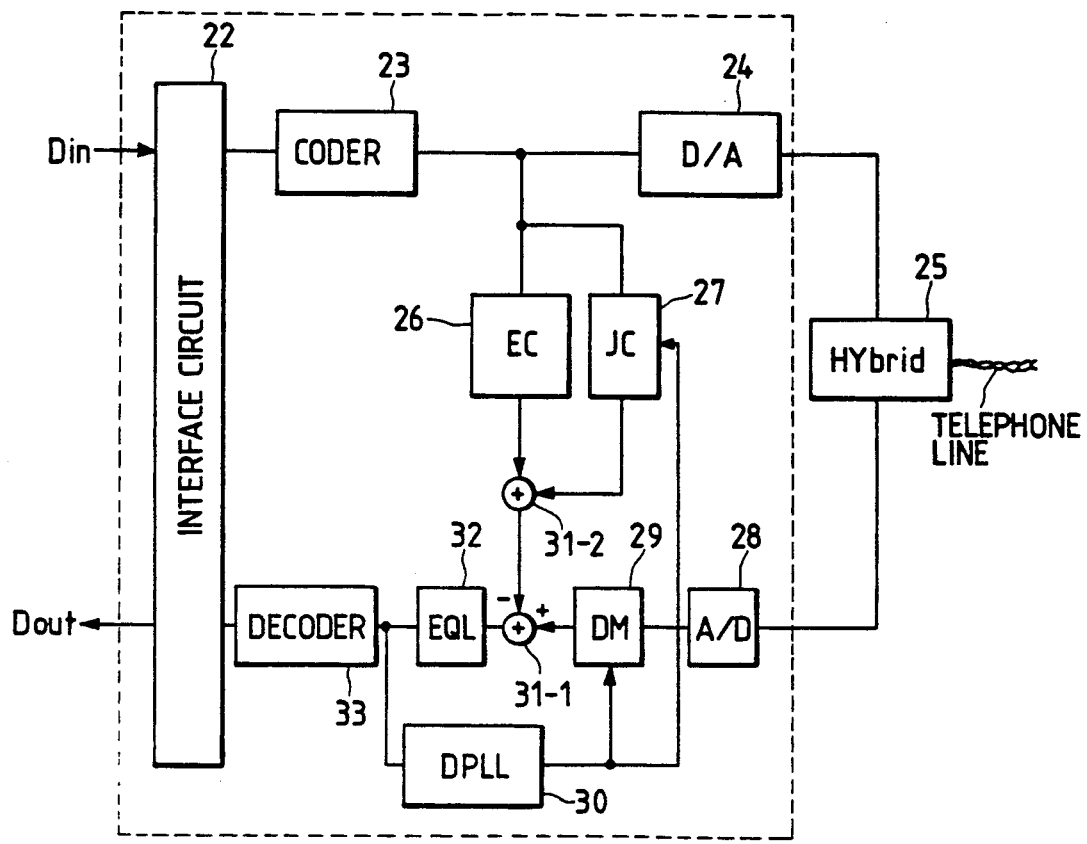
FIG. 8 is a typical system block diagram of an echo-canceller transmission apparatus employing the decimation-filter circuit provided by the present invention.
Figure 9:
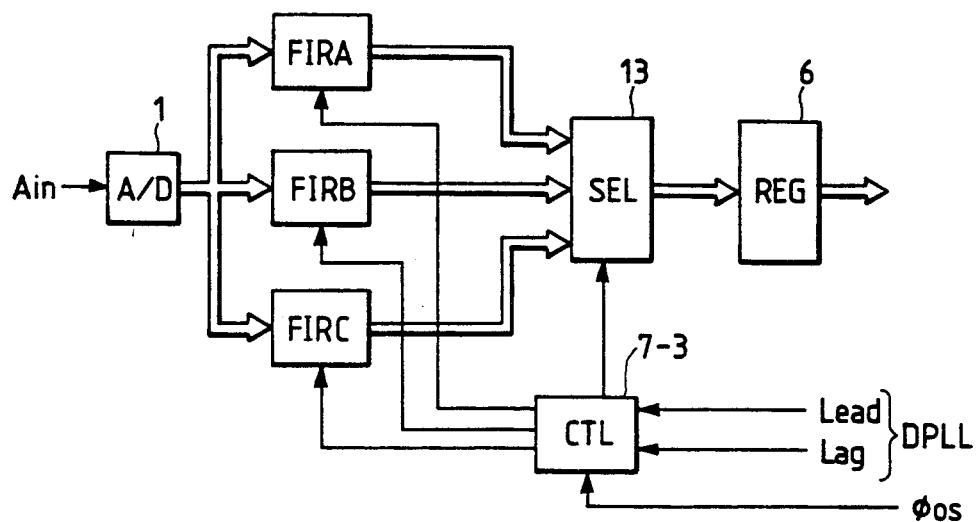
FIG. 9 is a typical block diagram of the conventional decimation filter.

Typically, the sampling clock signal $\phi$os is generated by a DPLL circuit 30 shown in FIG. 8. The DPLL circuit 30 receives a waveform-equalized signal output by the decimation filter 10-1, generating the sampling clock signal $\phi$os synchronized with the waveform-equalized signal. The DPLL circuit 30 further extracts phase information from the waveform-equalized signal, outputting a leading-phase signal Lead or a lagging-phase signal Lag.

The oversampling-type A/D converter circuit 1 typically adopts an oversampling technique using a sampling frequency several ten to several hundred times the frequency band of the analog input signal. The oversampling-type A/D converter circuit 1 is classified into several types depending upon the circuit configuration thereof. The types of the oversampling-type A/D converter circuit 1 include a delta-sigma ($\Delta\Sigma$) type described on pages 80 to 81, ISSCC '85, Digest of Technical Papers, February, 1985 and an interpolation type described on pages 180 to 181, ISSCC '86, Digest of Technical Papers, February, 1986. In addition, a circuit configuration requiring no operational amplifier in its analog-integrating circuit unit, as is described on pages 1003 to 1010, IEEE Journal of Solid-State Circuits, SC-21, December, 1986, is also proposed. In the circuit configuration, an analog voltage signal is converted into a current signal by using a voltage/current converter. The configuration includes a local D/A converter circuit comprising a current switch circuit. A differential current between an input signal and a feedback signal is integrated by an analog integration circuit that comprises a capacitor. The integration is carried out by charging the capacitor the other end of which is grounded to a direct potential.

Reference numeral 2 shown in FIG. 1 is a finite impulse response circuit serving as a filter processing unit. The filter processing unit 2 is a circuit capable of calculating a filter output with an unchanged phase for an output of the A/D converter circuit 1. The filter processing unit 2 comprises a first filter processor FIRX and a second filter processor FIRZ denoted by reference numerals 8 and 9 respectively. The filter processing unit 2 is equipped with, among other components, an integrating circuit, an adder and a shift circuit. A value representing a result of multiplying the magnitude of an impulse response by an output of the A/D converter circuit 1 is obtained as a decimation-filter output DMout. The decimation-filter output DMout is typically obtained at a frequency of 80 KHz. In other words, one decimation-filter output DMout is obtained for every 64 cycles of the sampling clock signal $\phi$os.

Reference numeral 3-1 is a compensation circuit for outputting compensation information for controlling the phase of the decimation-filter output DMout. The phase of the decimation-filter output DMout is controlled by shifting forward or backward the integration phase or the phase of the impulse response by one step, one period of the sampling clock signal $\phi$os. The integration phase is controlled in accordance with changes in output phase. In other words, the integration phase is shifted forward or backward when a leading or lagging output phase is detected from phase information extracted by the DPLL circuit 30. Later description will explain what information the compensation information actually is. In this embodiment, a piece of compensation information is typically obtained for every decimation-filter output cycle or every 64 cycles of the sampling clock signal $\phi$os from the first filter processor 8 by taking a predetermined step. In other words, pieces of the compensation information are obtained at a frequency of 80 KHz. In this embodiment, the step for acquiring compensation information for a leading phase is different from that for a lagging phase. The compensation circuit 3-1 is controlled by a control clock signal L2CLK output by a control circuit 7-1. If the DPLL circuit does not extract any phase change, no compensation information is acquired. In addition to the sampling clock signal $\phi$os, the leading-phase signal Lead and the lagging-phase signal Lag are supplied to the control circuit 7-1. When the leading-phase signal Lead is activated, the control clock signal L2CLK is varied with first timing and, for a leading phase, necessary compensation information is input from the first filter processor FIRX denoted by reference numeral 8 to the compensation circuit 3-1. When the lagging-phase signal Lag is activated, the control clock signal L2CLK is varied with second timing and, for a lagging phase, necessary compensation information is input from the first filter processor FIRX denoted by reference numeral 8 to the compensation circuit 3-1. When no phase control is performed as indicated by neither the leading-phase signal Lead nor the lagging-phase signal Lag activated, the control clock signal L2CLK is not activated. In this case, the output of the compensation circuit 3-1 is reset by a reset signal RS2 output by the control circuit 7-1 with predetermined timing synchronized with decimation-filter output cycles.

The outputs of the compensation circuit 3-1 and the first filter processor (FIRX) 8 are summed up by an adder 5-1 and then supplied to the second filter processor (FIRZ) 9. Receiving the output of the adder 5-1 and another output of the first filter processor (FIRX) 8, the second filter processor (FIRZ) 9 computes the filter output DMout.

REG denoted by reference numeral 6 is used for latching the output of the second filter processor 9. REG 6 is a register or a latch circuit which outputs digital data synchronized with timing of a digital circuit at a later stage. The output timing of the latch circuit 6 is synchronized with cycles typically having a frequency of 80 KHz. Receiving, among other things, the sampling clock signal $\phi$os, the leading-phase signal Lead and the lagging-phase signal Lag from the DPLL circuit, the control circuit 7-1 accordingly generates a variety of control clock signals such as the clock signal L2CLK and the reset signal RS2, controlling the operation timing of the filter processing unit 2, the compensation circuit 3-1 and the latch circuit 6.

Figure 2:
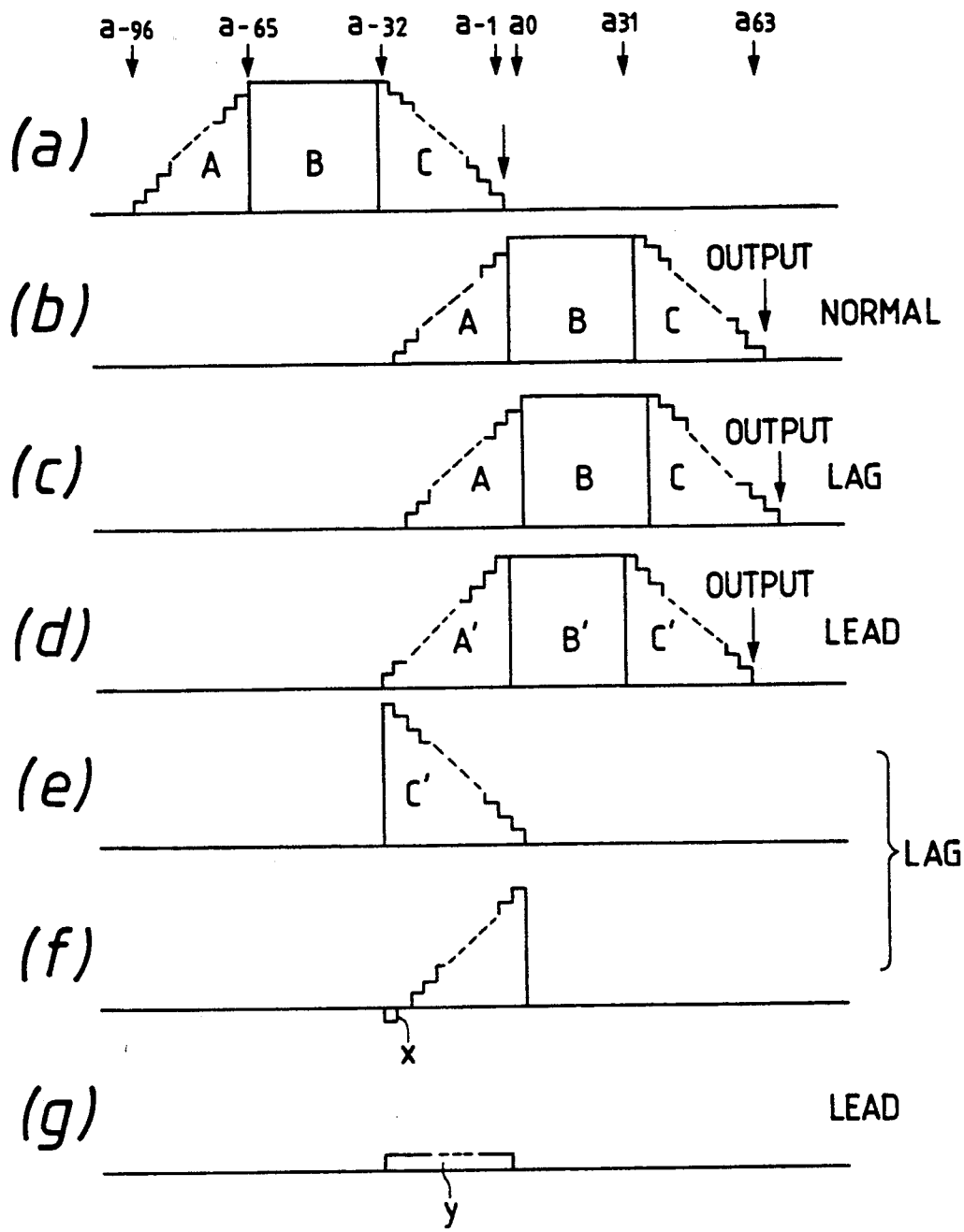
FIG. 2, consisting of FIGS. 2(a)-(g), is an explanatory diagram used for describing typical impulse responses of the decimation filter shown in FIG. 1 when used in a system with a variable output phase.

FIG. 2 is an explanatory diagram used for describing typical impulse responses of the decimation filter 10-1 shown in FIG. 1 when used in a system with a variable output phase. The horizontal axis of the figure is a time axis common to the impulse responses (a) to (g). FIG. 2 (a) shows a typical impulse response of the decimation filter 10-1 whereas FIG. 2 (b), (c) and (d) show next impulse responses for three cases: no phase change (a normal case), phase lag (a lagging-phase case) and phase lead (a leading-phase case) respectively. Points of time $a_{-96}$ to $a_{63}$ at which digital data output by the A/D converter circuit 1 is input by the decimation filter are shown above the impulse response (a) to illustrate their relations to the impulse responses shown in FIG. 2. A value representing a result of multiplication of the input digital data by the impulse response is the value of the decimation-filter output. As shown in the figure, the impulse response of the decimation filter 10-1 has a waveform with a length exceeding one output cycle which comprises 64 steps of the sampling clock signal $\phi$os. While a block C is being computed, it is thus necessary to calculate a block A of the next impulse pulse at the same time. In the case of a system with a variable output phase, three kinds of next output points shown in FIG. 2 (b), (c) and (d) exist for a previous output point shown in FIG. 2 (a). An output for a next output point has to be prepared accordingly.

Blocks A to C of the impulse response shown in FIG. 2 (a) can be represented by Expressions (1-A) to (1-C) as follows:

$$\sum_{i=-96}^{-65}(i+96)a_i + 32\sum_{i=-64}^{-33}a_i + \sum_{i=-32}^{i=-1}(-i)a_i =$$

Block A (1-A)

$$32\sum_{i=-96}^{-65}a_i - \sum_{n=-96}^{-65}\left(\sum_{i=-96}^{n}a_i\right)+$$

Block B (1-B)

$$32\sum_{i=-64}^{-33}a_i +$$

Block C (1-C)

$$\sum_{n=-32}^{-1}\left(\sum_{i=-32}^{n}a_i\right)$$

FIG. 2 (b) shows the phase of an impulse response or an integration phase required for obtaining a next filter output in a normal case in which the filter output does not have a phase change. Blocks A to C of the impulse response shown in FIG. 2 (b) can be represented by Expressions (2-A) to (2-C) as follows:

$$\sum_{i=-32}^{-1}(i+32)a_i + 32\sum_{i=0}^{31}a_i + \sum_{i=32}^{64}(64-i)a_i =$$

Block A (2-A)

$$32\sum_{i=-32}^{-1}a_i - \sum_{n=-32}^{-1}\left(\sum_{i=-32}^{n}a_i\right)+$$

Block B (2-B)

$$32\sum_{i=0}^{31}a_i +$$

Block C (2-C)

$$\sum_{n=32}^{63}\left(\sum_{i=32}^{n}a_i\right)$$

The first terms of Expressions (2-A) and (2-B) in the above equation can each be implemented by an integrating circuit and a $2^5$ bit shift circuit or a five-bit left-shift circuit used as a 32-time multiplier, Expression (2-C) representing the filter output of the block C can be implemented by a double-integrating circuit connected in series to an integrating circuit, The second term of Expression (2-A) representing the block A can be implemented by a double-integrating circuit, By paying attention to the time axes of FIGS. 2 (a) and (b), it becomes obvious that the second term of Expression (2-A) can be made common to Expression (1-C), an expression representing the block C of the previous impulse response.

FIG. 2 (c) shows the phase of an impulse response or an integration phase required for obtaining a next filter output in a lagging-phase case in which the phase of the filter output changes in the lagging direction. Blocks A to C of the impulse response shown in FIG. 2 (c) can be represented by Expressions (3-A) to (3-C) as follows:

$$\sum_{i=-31}^{0}(i+31)a_i + 32\sum_{i=1}^{32}a_i + \sum_{i=33}^{65}(65-i)a_i =$$

Block A (3-A)

$$32\sum_{i=-31}^{0}a_i - \sum_{n=-31}^{0}\left(\sum_{i=-31}^{n}a_i\right)+$$

-continued $$32 \sum_{i=1}^{32} a_i + \qquad \text{Block B (3-B)}$$

$$\sum_{n=33}^{64} \left( \sum_{i=33}^{n} a_i \right) \qquad \text{Block C (3-C)}$$

Since the second term of Expression (3-A) representing the block A cannot be made common to Expression (1-C) representing the block C of a previous impulse response, Expression (3-A) is modified into the following:

$$32 \sum_{i=-31}^{0} a_i - \sum_{n=-31}^{0} \left( \sum_{i=-31}^{n} a_i \right) = \qquad (4)$$

$$32 \sum_{i=-32}^{0} a_i - \sum_{n=-32}^{0} \left( \sum_{i=-32}^{n} a_i \right) + a_{-32}$$

The second term of Expression (4) represents a value computed by adding a step to the block C represented by Expression (1-C). The value expressed by the second term of Expression (4) has a magnitude represented by a block C' shown in FIG. 2 (e). A result obtained by subtracting the second term from the first term of Expression (4) is shown in FIG. 2 (f). x shown in FIG. 2 (f) is $-a_{-32}$. By comparing FIG. 2 (c) to FIG. 2 (f), it is obvious that the second term of Expression (3-A) representing the block A can be made common to Expression (1-C) representing the block C of a previous impulse response if the compensation circuit 3-1 outputs a signal with a magnitude of $-a_{-32}$. In other words, the magnitude $-a_{-32}$ is compensation information required for a leading-phase case.

FIG. 2 (d) shows the phase of an impulse response or an integration phase required for obtaining a next filter output in a leading-phase case in which the phase of the filter output changes in the leading direction. Blocks A' to C' of the impulse response shown in FIG. 2 (d) can be represented by Expressions (5-A') to (5-C') as follows:

$$\sum_{i=-33}^{-1} (i + 33)a_i + 32 \sum_{i=0}^{30} a_i + \sum_{i=31}^{63} (63 - i)a_i =$$

$$32 \sum_{i=-32}^{-1} a_i - \sum_{n=-32}^{-2} \left( \sum_{i=-32}^{n} a_i \right) + \qquad \text{Block A' (5-A')}$$

$$32 \sum_{i=0}^{30} a_i + \qquad \text{Block B' (5-B')}$$

$$\sum_{n=31}^{62} \left( \sum_{i=31}^{n} a_i \right) \qquad \text{Block C' (5-C')}$$

Much like the lagging-phase case, the second term of Expression (5-A') representing the block A' cannot be made common to Expression (1-C) representing the block C of a previous impulse response. Expression (3-A') is therefore modified into the following:

$$32 \sum_{i=-32}^{-1} a_i - \sum_{n=-32}^{-2} \left( \sum_{i=-32}^{n} a_i \right) = \qquad (6)$$

$$32 \sum_{i=-32}^{-1} a_i - \sum_{n=-32}^{-1} \left( \sum_{i=-32}^{n} a_i \right) + \sum_{i=-32}^{-1} a_i$$

The second term on the right-hand side of Eq. (6) is the same as Expression (1-C) for the block C. By outputting the third term on the right-hand side of Eq. (6) from the compensation circuit 3-1, the second term of Expression (5-A') representing the block A' in a leading-phase case can thus be made common to Expression (1-C) representing the block C. Y shown in FIG. 2 (g) is the output to be generated by the compensation circuit 3-1 in a leading-phase case. Y represents compensation information required in a leading-phase case and has the following magnitude:

$$y = \sum_{i=-32}^{-1} a_i$$

Figure 3:
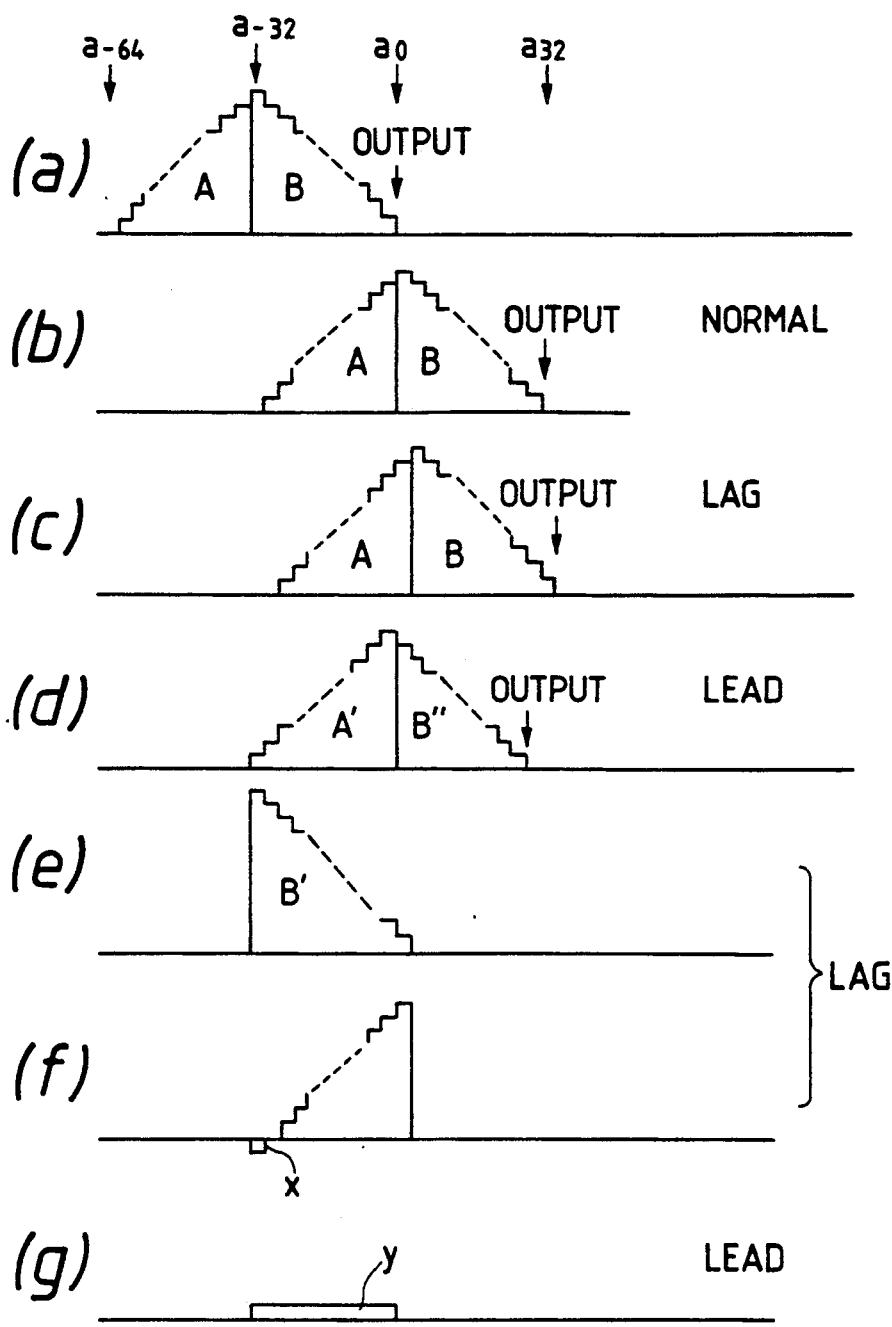
FIG. 3, consisting of FIGS. 3(a)-(g), is an explanatory diagram used for describing other typical impulse responses of the decimation filter shown in FIG. 1 when used in a system with a variable output phase.

FIG. 3 is an explanatory diagram used for describing other typical impulse responses of the decimation filter shown in FIG. 1 when used in a system with a variable output phase. The horizontal axis of the figure is a time axis common to the impulse responses (a) to (g). Points of time $a_{-64}$ to $a_{32}$ at which digital data output by the A/D converter circuit 1 is input by the decimation filter are shown above the impulse response (a). Blocks A and B of the impulse response shown in FIG. 3 (a) are represented by Expressions (7-A) and (7-B) respectively as follows:

$$\sum_{i=-64}^{-33} (i + 64)a_i + \sum_{i=-32}^{0} (-i)a_i =$$

$$32 \sum_{i=-64}^{-33} a_i - \sum_{n=-64}^{-33} \left( \sum_{i=-64}^{n} a_i \right) + \qquad \text{Block A (7-A)}$$

$$\sum_{n=-32}^{-1} \left( \sum_{i=-32}^{n} a_i \right) \qquad \text{Block B (7-B)}$$

FIG. 3 (b) shows the phase of an impulse response or an integration phase required for obtaining a next filter output in a normal case in which the filter output does not have a phase change. Blocks A and B of the impulse response shown in FIG. 3 (b) can be represented by Expressions (8-A) and (8-B) respectively as follows:

$$\sum_{i=-32}^{-1} (i + 32)a_i + \sum_{i=0}^{32} (32 - i)a_i =$$

$$32 \sum_{i=-32}^{-1} a_i - \sum_{n=-32}^{-1} \left( \sum_{i=-32}^{n} a_i \right) + \qquad \text{Block A (8-A)}$$

$$\sum_{n=0}^{31} \left( \sum_{i=0}^{n} a_i \right) \qquad \text{Block B (8-B)}$$

Much like the concept shown in FIG. 2, the second term of Expression (8-A) can be made common to Expression (7-C), an expression representing the block C of the previous impulse response.

FIG. 3 (c) shows the phase of an impulse response or an integration phase required for obtaining a next filter output in a lagging-phase case in which the phase of the filter output changes in the lagging direction. Blocks A and B of the impulse response shown in FIG. 3 (c) can be represented by Expressions (9-A) and (9-B) respectively as follows:

$$\sum_{i=-31}^{0} (i + 31)a_i + \sum_{i=0}^{33} (33 - i)a_i =$$

$$32 \sum_{i=-31}^{0} a_i - \sum_{n=-31}^{0} \left( \sum_{i=-31}^{n} a_i \right) + \quad \text{Block A (9-A)}$$

$$\sum_{n=1}^{32} \left( \sum_{i=1}^{n} a_i \right) \quad \text{Block B (9-B)}$$

Expression (9-A) representing the block A is modified into Expression (10) as follows:

$$32 \sum_{i=-31}^{0} a_i - \sum_{n=-31}^{0} \left( \sum_{i=-31}^{n} a_i \right) = \quad (10)$$

$$32 \sum_{i=-32}^{0} a_i - \sum_{n=-32}^{0} \left( \sum_{i=-32}^{n} a_i \right) + a_{-32}$$

The second term of Expression (10) represents a value computed by adding a step to the block B represented by Expression (7-B). The value expressed by the second term of Expression (10) has a magnitude represented by a block B' shown in FIG. 3 (e). A result obtained by subtracting the second term from the first term of Expression (10) is shown in FIG. 3 (f). x shown in FIG. 3 (f) is $-a_{-32}$. It is obvious that the second term of Expression (9-A) representing the block A can be made common to Expression (7-B) representing the block C of a previous impulse response if the compensation circuit 3-1 outputs a signal with a magnitude of $-a_{-32}$. In other words, the magnitude $-a_{-32}$ is compensation information required for a leading-phase case.

FIG. 3 (d) shows the phase of an impulse response or an integration phase required for obtaining a next filter output in a leading-phase case in which the phase of the filter output changes in the leading direction. Blocks A' and B' of the impulse response shown in FIG. 3 (d) can be represented by Expressions (11-A') and (11-B') respectively as follows:

$$\sum_{i=-33}^{-1} (i + 33)a_i + \sum_{i=0}^{31} (31 - i)a_i =$$

$$32 \sum_{i=-32}^{-1} a_i - \sum_{n=-32}^{-2} \left( \sum_{i=-32}^{n} a_i \right) + \quad \text{Block A' (11-A')}$$

$$\sum_{n=0}^{32} \left( \sum_{i=0}^{n} a_i \right) \quad \text{Block B'' (11-B'')}$$

Much like the lagging-phase case, Expression (11-A') is modified into the following:

$$32 \sum_{i=-32}^{-1} a_i - \sum_{n=-32}^{-2} \left( \sum_{i=-32}^{n} a_i \right) = \quad (12)$$

$$32 \sum_{i=-32}^{-1} a_i - \sum_{n=-32}^{-1} \left( \sum_{i=-32}^{n} a_i \right) + \sum_{i=-32}^{-1} a_i$$

The second term on the right-hand side of Eq. (6) is the same as Expression (7-B) for the block B. By outputting the third term on the right-hand side of Eq. (12) from the compensation circuit 3-1, the second term of Expression (11-A') representing the block A' in a leading-phase case can thus be made common to Expression (7-B) representing the block B. Y shown in FIG. 3 (g) is the output to be generated by the compensation circuit 3-1 in a leading-phase case. Y represents compensation information required in a leading-phase case.

Figure 4:
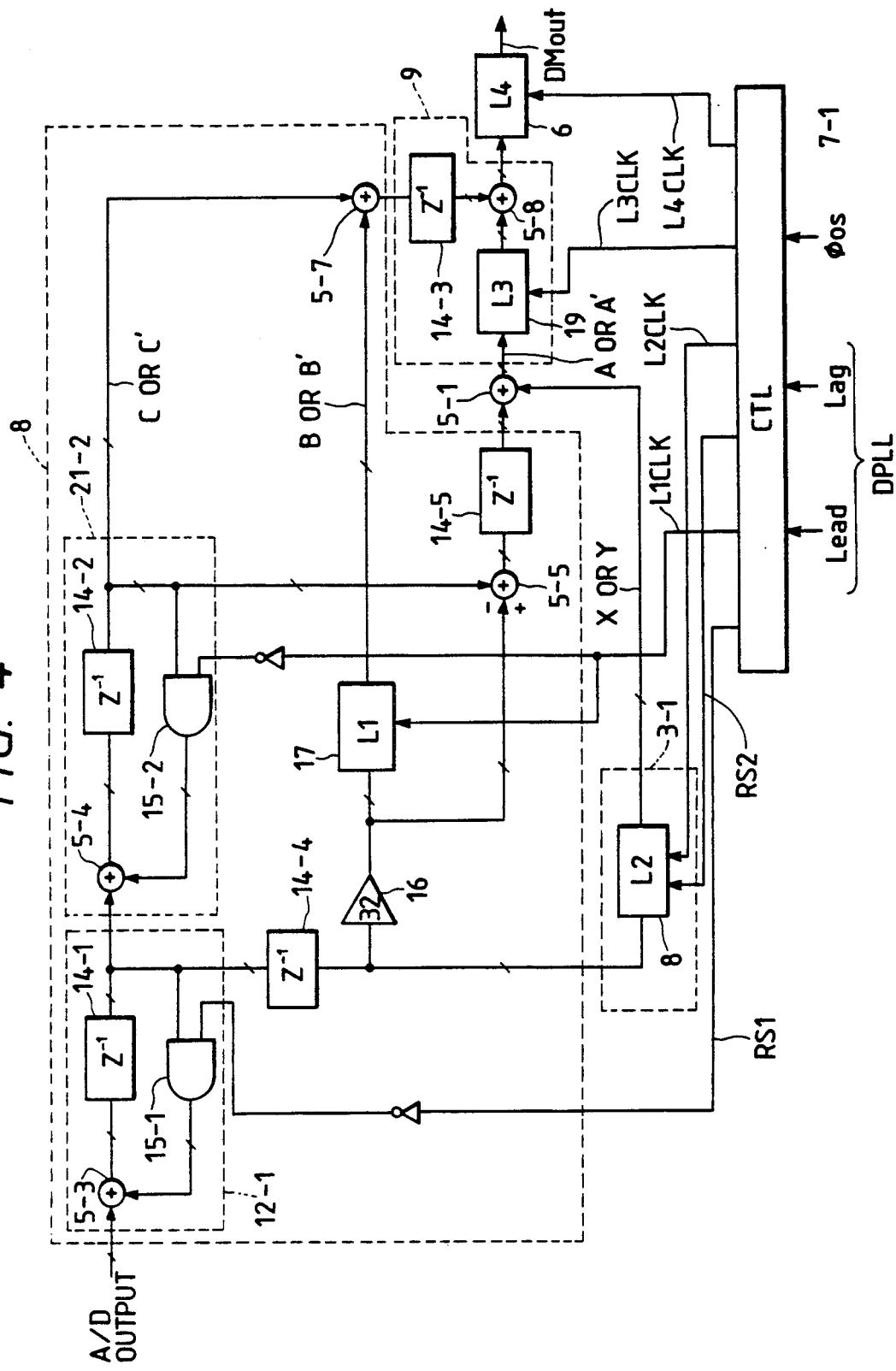
FIG. 4 is a detailed circuit diagram of an embodiment implementing a decimation filter having the impulse responses shown in FIG. 2.

FIG. 4 is a detailed circuit diagram of an embodiment implementing the decimation filter 10-1 having the impulse responses shown in FIG. 2. Reference numerals 14-1 to 14-5 shown in the figure each denote a delay circuit (Z-1) having a delay time equal to one period of the sampling clock signal $\phi os$ of the A/D converter circuit 1. Reference numerals 17 to 19 and 6 are latch circuits L1, L2, L3 and L4, the timings of which are controlled by clock signals L1CLK, L2CLK and L3CLK output by the control circuit 7-1. The latch circuit L2 denoted by reference numeral 18 is an example of the compensation circuit 3-1 which has a reset function. Any signal line denoted by the symbol / in the figure denotes an n-bit data lines. Thus, a circuit block or component connected to such a signal line also has an n-bit configuration.

Reference numerals 21-1 and 21-2 shown in FIG. 4 are integrating circuits connected in series to each other. The integrating circuit 21-1 comprises the delay circuit 14-1 cited earlier, a two-input AND gate 15-1 and an adder 5-3. One of the two inputs of the AND gate 15-1 is connected to the output of the delay circuit 14-1 whereas the other input is provided with the reset signal RS1 generated by the control circuit 7-1. With the reset signal RS1 set to a high level, the integrated value of the integrating circuit 21-1 is reset. Similarly, one of the two inputs of an AND gate 15-2 is connected to the output of the delay circuit 14-2 cited earlier whereas the other input is provided with the clock signal L1CLK generated by the control circuit 7-1. With the clock signal L1CLK set to a high level, the integrated result of the integrating circuit 21-2 is reset. Reference numeral 16 shown in the figure is a five-bit left-shift circuit serving as a constant (32)-time multiplier. Notations A, A', B, B', C and C' denote nodes the values of which correspond to the blocks A, A', B, B', C and C' shown in FIG. 2. The delay circuits 14-3, 14-4 and 14-5 each delay data typically by means of an adder even though they are not limited to such a delaying technique.

Figure 5:
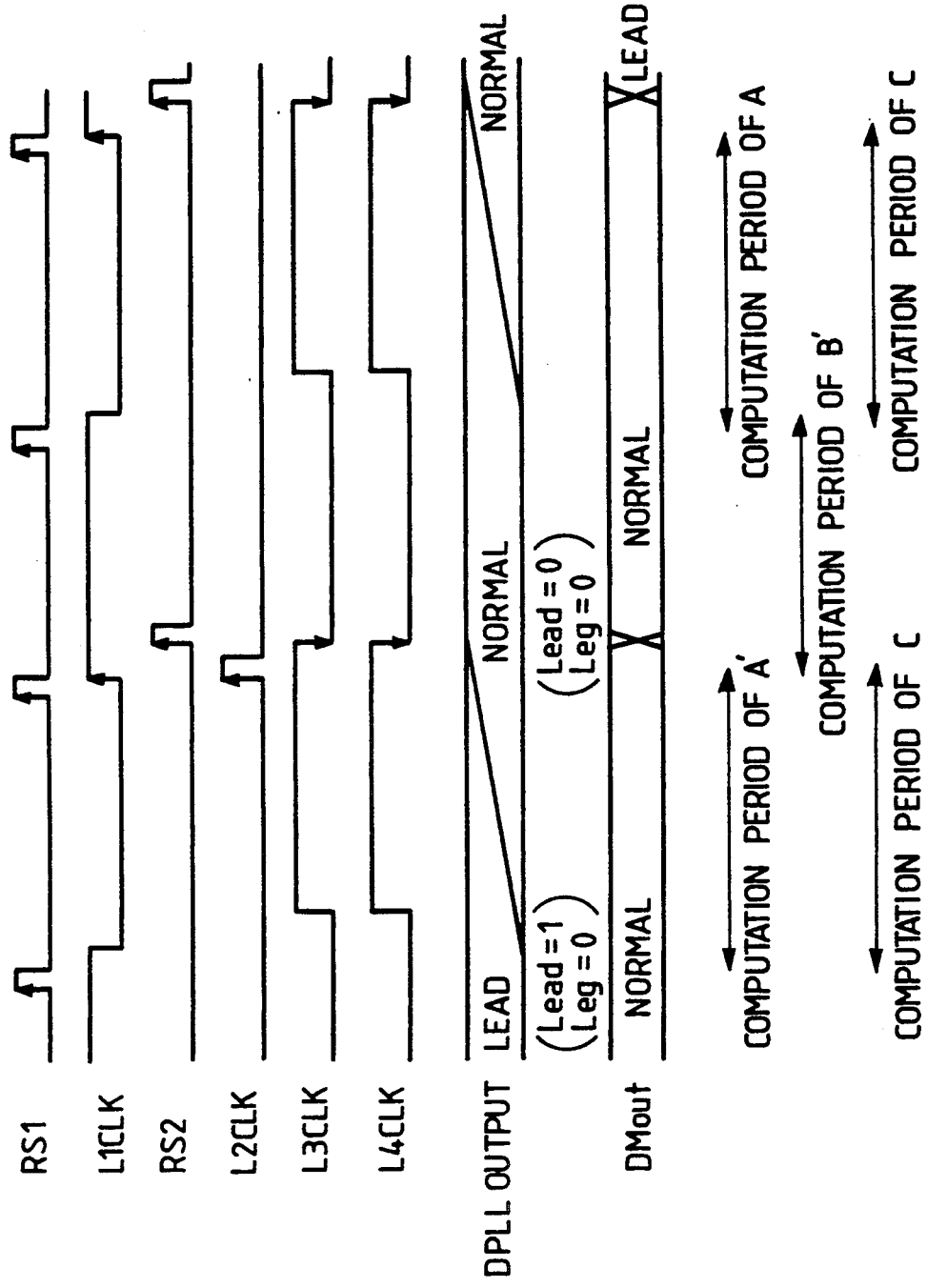
FIG. 5 is an operation timing chart of the circuit shown in FIG. 4 with a leading phase.
Figure 6:
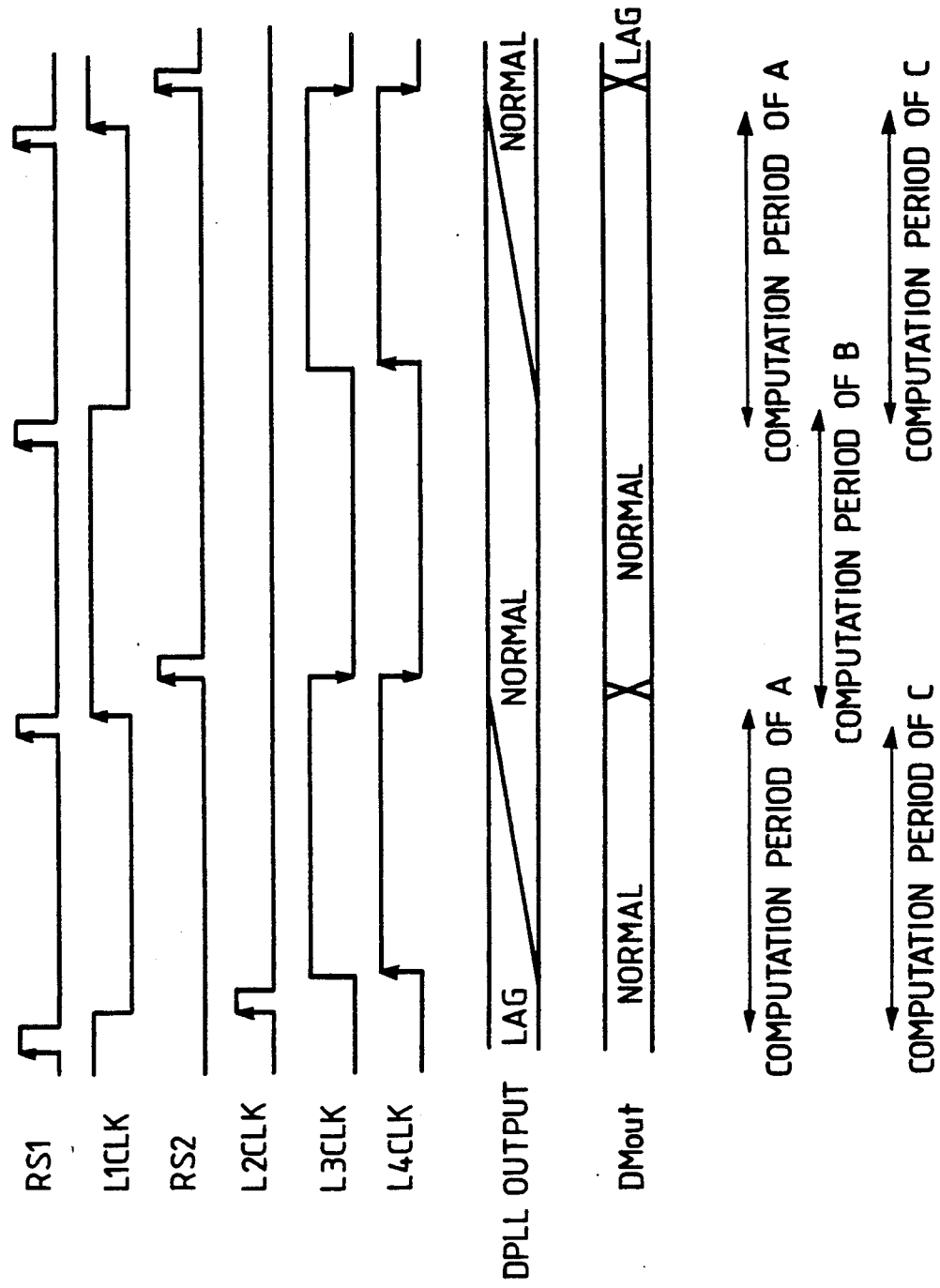
FIG. 6 is an operation timing chart of the circuit shown in FIG. 4 with a lagging phase.

The clock signals L1CLK, L2CLK, L3CLK and L4CLK as well as the reset signals RS1 and RS2 output by the control circuit 7-1 vary as shown by waveforms of FIGS. 5 and 6 when the lagging-phase signal Lead and the leading-phase signal Lag are activated respectively.

First of all, the output of the A/D converter circuit 1 is supplied to the integrating circuit 21-1 and then further fed to the integrating circuit 21-2 at the next step A point C or C' the output of the integrating circuit 21-2, has a value expressed by Eq. (13) as has been described by referring to FIG. 2.

$$C = \sum_{n=1}^{k} \left( \sum_{i=1}^{n} a_i \right) \quad (13)$$

The output of the integrating circuit 21-1 is also supplied to the delay circuit 14-4, being multiplied by 32 by means of the five-bit left-shift circuit 16. The result of the multiplication is then latched in the latch circuit 17. As has been described by referring to FIG. 2, the output of the latch circuit 17 B or B' has a value expressed by Eq. (14) as follows:

$$B = 32 \sum_{i=1}^{k} a_i \qquad (14)$$

The output of the delay circuit 14-4 is supplied to the latch circuit 18, which corresponds to the compensation circuit 13-1, to produce the compensation values x and y shown in FIG. 2. To be more specific, x is a value obtained by substituting k = 1 and n = 1 to Eq. (13) and held in the latch circuit 18 as a compensation value for a lagging-phase case. As shown in FIG. 6, the hold timing is determined by the rising edge of the clock signal L2CLK. Likewise, y is a value obtained by substituting k = 1 to Eq. (13) and held in the latch circuit 18 as a compensation value for a leading-phase case. As shown in FIG. 5, the hold timing is determined by the rising edge of the clock signal L2CLK.

An adder 5-5 outputs a value A given below for a normal case in which there is no phase change:

$$A = 32 \sum_{i=1}^{k} a_i - \sum_{n=1}^{k} \left( \sum_{i=1}^{n} a_i \right)$$

The value A is obtained by subtracting the output of the integrating circuit 21-2 from the output of the five-bit left-shift circuit 16 which is equal to the input of the five-bit left-shift circuit 16 multiplied by 32. The adder 5-1 adds the output of the compensation circuit 3-1 to the value A for a fixed-phase case, producing an output A or A' for a leading-phase case or a lagging-phase case respectively. With no phase change, the output of the compensation circuit 3-1 is zero. Essentially, the adder 5-1 thus performs no addition. The latch circuit 19 latches the output A or A' on the falling edge of the clock signal L3CLK. The latch circuit L4 denoted by reference numeral 6 transmits data to a digital circuit at the subsequent stage with timing determined by the falling edge of the clock signal L4CLK.

FIG. 5 is an operation timing chart of the decimation filter shown in FIG. 4 in a leading-phase case wherein the leading-phase signal Lead is activated. FIG. 5 also shows calculation segments of the blocks A, A', B' and C shown in FIG. 2 for the operation timing The reset signal RS1 is used for resetting the integrating circuit 21-1 at a frequency of 160 KHz when there is no phase change. The integrating circuit 21-1 at the first stage, which is reset by the reset signal RS1, operates at all calculation segments of the blocks A, A', B' and C. On the other hand, the clock signal L1CLK is used for resetting the integrating circuit 21-2 at the second stage and used as a latch signal for the latch circuit 17. The latch circuit 17 latches the output of the integrating circuit 21-1 of at first first stage in the calculation segment for the block B'. The integrating circuit 21-2 operates only during the calculation segments for the block A or A' and the block C. The reset signal RS2 serves as a reset signal for the latch circuit 18, resetting the latch circuit 18 at a frequency of 80 KHz in a normal case wherein there is no phase change. The latch circuit 18 latches data synchronously with transitions of the clock signal L2CLK to a high level. With timing shown in FIG. 5, the latch circuit 18 latches the output of the integrating circuit 21-1 at the first stage in the calculation segment for the block A'. The output of the integrating circuit 21-1 in the calculation segment for the block A' corresponds to Y shown in FIG. 2 (g). The clock signal L3CLK latches the sum of the data of the calculation segment for the block A' and the output of the latch circuit 18 on its falling edge. The clock signal L4CLK prescribes output timing for data output by the decimation filter 10-1; the data changes the mode from normal to leading phase or vice verse on the falling edge of the clock signal L4CLK as shown in FIG. 5. It is obvious from the figure that leading-phase information obtained from the DPLL circuit is reflected in the filter output DMout, lagging by one segment of the 80-KHz frequency.

FIG. 6 shows an operation timing chart of the decimation filter 10-1 shown in FIG. 4 and the corresponding calculation segments of the blocks A, B and C with the lagging-phase signal Lag activated by the DPLL circuit. The signals RS1, L1CLK, RS2, L3CLK and L4CLK vary in the same manner as that shown in FIG. 5. The latch timing of the latch circuit 18 is determined by the rising edge of the clock signal L2CLK. With the timing shown in FIG. 6, an initial value is latched during the calculation segment of the block A. This corresponds to the compensation information x shown in FIG. 2 (f). Also in the case of the timing shown in FIG. 6, the lagging-phase information obtained from the DPLL circuit is reflected in the filter output DMout, lagging behind the time the information is received by a calculation segment corresponding to a frequency of 80 KHz.

With the embodiment described above, the output phase of the decimation filter can be controlled in units each having a magnitude equal to a period of the sampling clock signal φos, resulting in correct operation even for a system having digital data with a variable output phase. Unlike the conventional circuit configuration, not all the three filter processing units are required. Thus, the size of the circuit for a system having digital data with a variable output phase is not much larger than that for a fixed-phase system. With such a circuit, operations equivalent to those offered by the conventional technology can be accomplished, allowing a system to be implemented with no conversion errors produced by the A/D converter circuit 1 even in the event of a phase change.

Figure 7:
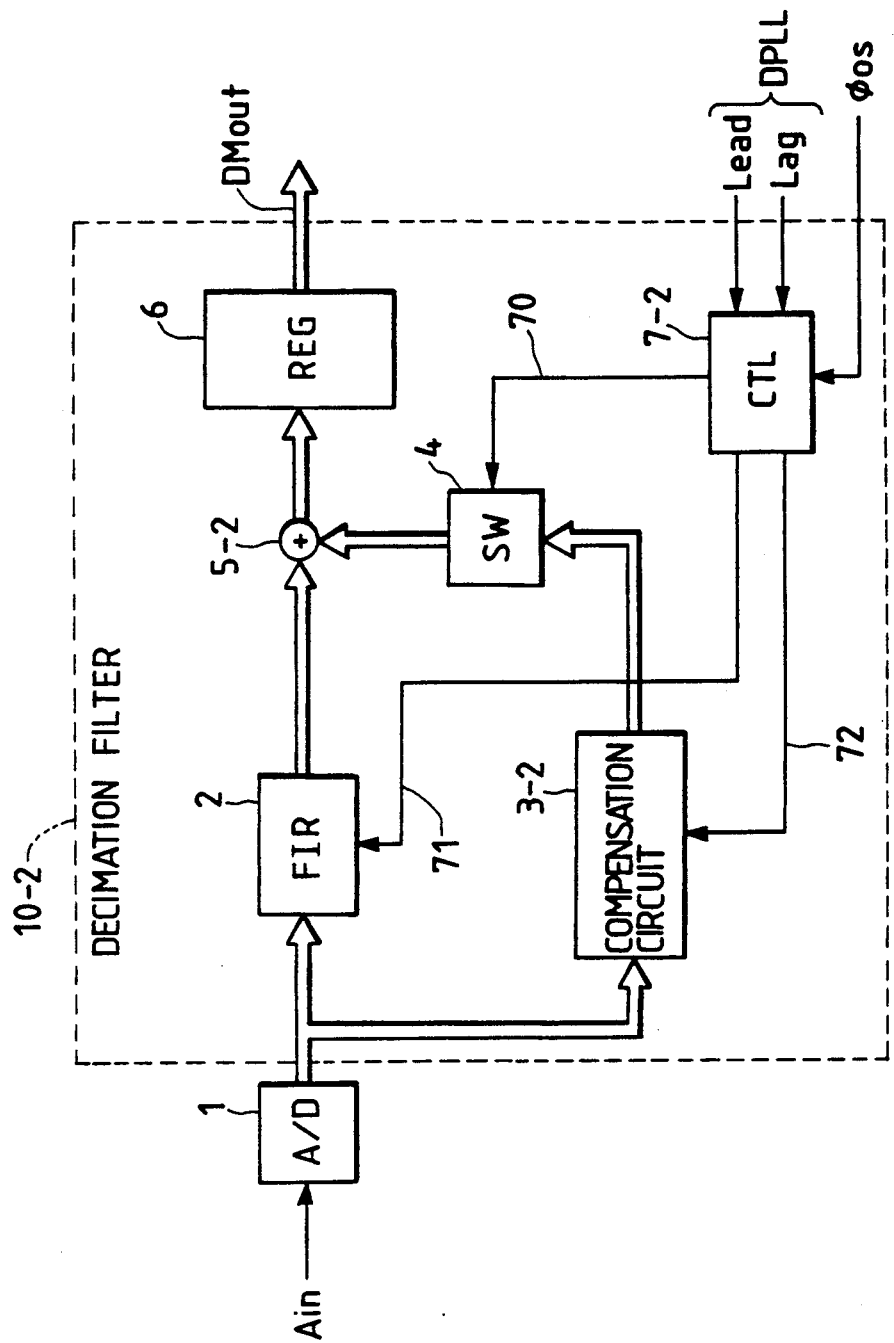
FIG. 7 is a block diagram of another embodiment implementing a decimation filter in accordance with the present invention.

FIG. 7 is a block diagram of another embodiment implementing a decimation filter in accordance with the present invention. A decimation filter 10-2 shown in the figure is used specially for a system with a variable output phase. As shown in the figure, the decimation filter 10-2 is connected to the output of an oversampling-type A/D converter circuit 1. Reference numeral 2 is a filter processing unit such as a finite-length impulse-response circuit. The filter processing unit 2, which is also referred to hereafter as a FIR, is a circuit for computing a filter output for an unchanged phase from the output of the A/D converter circuit 1. A compensation circuit 3-1 is used for controlling the output phase of the decimation filter 10-2 in accordance with a signal Lead or Lag from a DPLL circuit. To be more specific, the compensation circuit 3-1 computes a difference in output of the decimation filter 10-2 between a case with a modified output phase and a case with no output-phase change. Note that the output phase can be changed into a leading or lagging phase. Reference numeral 4 is a switch circuit SW which is controlled by an output select signal generated by a control circuit CTL denoted by reference numeral 7-2. When the output phase changes, the switch circuit SW 4 is turned on. With the switch circuit 4 turned on, an adder 5-2 computes the sum of the output of the FIR 2 and that of the compensation circuit 3-2. Reference numeral 6 is a register or a latch circuit for latching the output of the adder 5-2 and outputting digital data with timing adjusted to a digital circuit at a later stage. Receiving a leading-phase signal Lead, a lagging-phase signal Lag and a sampling clock signal $\phi$os from the DPLL circuit, the control circuit 7-2 generates a switch control signal 70 accordingly for controlling the switch circuit 4. In addition, the control circuit 7-2 outputs an operation control signal 71 for the filter processing unit 2 and another operation control signal 72 for the compensation circuit 3-2 based on the leading-phase signal Lead, the lagging-phase signal Lag and the sampling clock signal $\phi$os.

In the decimation filter 10-2 with the configuration described above, the filter processing unit 2 computes a filter output for an unchanged phase. Receiving an input digital signal supplied to the filter processing unit 2, the compensation circuit 3-2 computes a difference in decimation-filter output between a case of an unchanged phase and a case of a varied phase. Receiving a signal Lead or Lag from the DPLL circuit, the control circuit 7-2 notifies the compensation circuit 3-2 through the control signal 72 of a leading or lagging phase in the event of a phase change. In accordance with an instruction given by the control signal 72, the compensation circuit 3-2 computes a difference in decimation-filter output between the unchanged phase and the leading or lagging phase. When the phase changes, the switch circuit 4 is turned on by the switch control signal 70, forwarding the output of the compensation circuit 3-2 to the adder 5-2 to be added to the output of the filter processing unit 2, a computation result for the unchanged phase. The output of the compensation circuit 3-2 is a computed value representing a difference between a case, in which the phase of the impulse response waveform produced by the filter processing unit 2 is leading or lagging by one period of the sampling clock signal $\phi$os, and a case with an unchanged phase. In this way, the output phase of the decimation filter can be controlled in units each having a magnitude equal to one period of the sampling clock signal $\phi$os, resulting in correct operation even for a system having digital data with a variable output phase. Unlike the conventional circuit configuration, not all the three filter processing units are required. Thus, the size of the circuit for a system having digital data with a variable output phase is not much larger than that for a fixed-phase system. With such a circuit, operations equivalent to those given by the conventional technology can be accomplished, allowing a system to be implemented with no conversion errors produced by the A/D converter circuit 1 even in the event of a phase change. It should be noted that, in this embodiment, since the compensation circuit 3-2 receives an input digital signal supplied to the filter processing unit 2, hence computing the difference separately from the filter processing unit 2, the size of its circuitry increases only slightly in comparison with a configuration in which compensation information is acquired by diverting information obtained in the course of processing at the filter processing unit 2 such is the case with the compensation circuit described by referring to FIGS. 1 and 4.

FIG. 8 is a system block diagram of a typical application employing the decimation-filter circuit provided by the present invention. The application is an echo-canceller transmission apparatus used in a subscriber-line transmission apparatus of an integrated service digital network. The block enclosed by a dashed line in the figure is a circuit component implemented by a single LSI device. In the echo-canceller transmission apparatus, first of all, digital input data Din is synchronized internally by an interface circuit 22. The data is then converted into a 2B1Q code by a coder 23 before a frame synchronization pattern is added thereto. Subsequently, the data is converted into an analog signal by a D/A converter 24 and then output to a telephone line through a hybrid circuit 25 as a transmission signal. Even with the hybrid circuit 25, however, the transmission signal cannot be separated completely from a reception signal, causing part of the transmission signal to be inadvertently rerouted into a reception-signal system. The rerouted part of the transmission signal is called an echo signal. An estimate signal produced by an echo-canceller circuit 26 is used for eliminating such an echo signal. A reception signal, an echo signal of which has been eliminated by an adder 31-1, is waveform-equalized by a waveform-equalizer EQL denoted by reference numeral 32. The signal is then decoded by a decoder 33. Subsequently, frame synchronization patterns are separated from the signal. The signal is finally output to the outside world as digital data through the interface circuit 22. A DPLL circuit 30 extracts phase information from the waveform-equalized reception signal, outputting a leading-phase signal Lead and a lagging-phase signal Lag to a decimation filter DM and a jitter compensator JC denoted by reference numerals 29 and 27 respectively. The decimation filter DM shown in FIG. 8 is no other than the decimation filter 10-1 or 10-2 described earlier whereas the A/D converter circuit 28 is the oversampling-type A/D converter circuit 1 explained before.

The jitter compensator 27 is a circuit for cancelling echo-signal components which are generated separately when the output phase of the decimation filter 29 changes. When a phase shift occurs, the jitter compensator 27 outputs compensation data which is added to the output of the echo canceller 26 by an adder 31-2. By applying the decimation filter 29 provided by the present invention, the decimation filter 29 always outputs a correct value even if a phase shift occurs. The DPLL circuit 30 can thus extract phase information from a correct reception signal. As a result, the system, as a whole, operates in a stable manner. In addition, the phase information of the DPLL circuit 30 is reflected in the output of the decimation filter 29, lagging by one period as shown in FIGS. 5 and 6. Therefore, the embodiment is built into such a configuration that the jitter compensator 27 outputs compensation data also lagging behind information received from the DPLL circuit 30 by one period. It is easy to implement the echo-canceller circuit 26, the jitter compensator 27, the waveform equalizer 32 and the DPLL circuit 30 by using a DSP (Digital Signal Processor). As a result, the components of this echo-canceller transmission apparatus can be embedded in an LSI chip without employing an analog PLL circuit.

The present invention discovered by the inventor has been described in detail through a couple of embodiments. It is to be understood expressly, however, that the embodiments are for purpose of detailed description only and are not intended as a definition of the limits of the present invention. It is needless to say that a variety of modified versions can be regarded as applications of the present invention as long as they are in a range not deviating from the gists of the present invention. For example, a circuit employed in the embodiment, which has an impulse response shown in FIG. 2, is described in detail by referring to FIG. 4. It should be noted, however, that the present invention is not limited to such a circuit. A circuit with an impulse response shown in FIG. 3 can also be used as well. In this case, an actual circuit configuration can be implemented with ease in accordance with the explanation of FIG. 3. Other impulse responses having different waveforms will also work as well.

In the description given so far, the invention discovered by the inventor is mainly explained through an application to a subscriber-line transmission apparatus of an integrated service digital network. It is also to be understood expressly, however, that the subscriber-line transmission apparatus of an integrated service digital network is for purpose of detailed description only and is not intended as a definition of the applications of the present invention. It is needless to say that the present invention can also be applied to other transmission apparatuses such as a modem. In addition, the decimation filter can be placed not only at an end stage of an oversampling-type A/D converter, but also at an end stage of an apparatus or a circuit for outputting a large amount of data but with a relatively low degree of accuracy in a wide range of applications that require that data be converted into highly accurate one.

The following effects can be obtained from the present invention described in this specification.

The present invention provides a decimation filter comprising:

a filter processing unit 2 for processing input digital data in a predetermined integration phase-state and producing a filter output; and a compensation circuit 3-2 for receiving the input digital data and computing a difference in magnitude between a filter output with an integration phase lagging behind or leading ahead of the predetermined integration-phase state and a filter output with an unchanged integration phase. Accordingly, the decimation filter provided by the present invention can function correctly without employing filter processing units, other than the aforementioned filter processing unit 2, for use in phase control which can cope with an integration phase lagging behind or leading ahead of the predetermined integration-phase state. As a result, a decimation filter allowing the output phase to be controlled can be implemented in a system, wherein the output phase of its digital data changes, without bringing about a circuit size much larger than that of a decimation filter used in an unchanged-phase system.

In the decimation filter provided by the present invention as described above, predetermined information is acquired by the compensation circuit 3-1 with the predetermined timing from the the filter processing unit 2 in the course of processing. In accordance with the acquirement timing, the acquired information is transformed into compensation information representing a difference in magnitude between a filter output with an integration phase lagging behind or leading ahead of the predetermined integration-phase state and a filter output with an unchanged integration phase. The compensation information is fed back to the filter processing unit 2 to allow a controllable-phase filter output to be produced. With this configuration, the phase of the filter output can thus be controlled by a single filter processing unit without the necessity for incorporating a plurality of circuits each identical with the filter processing unit 2. As a result, a decimation filter allowing the output phase to be controlled can be implemented in a system, wherein the output phase of digital data changes, without bringing about a circuit size much larger than that of a decimation filter used in an unchanged-phase system.

Since the compensation circuit 3-1 is employed for acquiring compensation information by stealing information in the course of processing by the filter processing unit 2, the circuit size of the decimation filter can be further made smaller than a compensation circuit 3-2 which computes a difference value in a process separate from the filter processing unit 2 by inputting the same signal as the input digital data supplied to the filter processing unit.

The compensation circuit 3-1 acquires the compensation information from the filter processing unit 2 by stealing information in the course of processing by the filter processing unit 2. Accordingly, a very fine phase control can be ensured with ease by using the period of a reference clock signal for filter processing in the filter processing unit 2 as a smallest control unit. Typically, a sampling clock signal of the oversampling-type A/D converter circuit is adopted as the reference clock signal of the filter processing.

With an A/D converter having a configuration comprising a decimation filter provided by the present invention and an oversampling-type A/D converter circuit, analog-to-digital data conversion with excellent performance can be implemented even if the A/D converter is used in a system in which the output phase of its digital data varies. By applying such an A/D converter to a subscriber-line transmission apparatus, a good transmission performance can be sustained.

We claim:

1. A running-average filter for producing a filter output by integrating an input digital signal in accordance with an integration phase and computing a running average of said input digital signal, said running-average filter comprising:

a filter processing unit for processing said input digital signal in a predetermined integration-phase state and producing a plurality of processing results;

a compensation circuit for receiving the processing results and computing a difference in magnitude between one of the processing results with an integration phase lagging behind or leading ahead of said predetermined integration-phase state and another of the processing results with an unchanged integration phase; and an adder for selectively adding said difference to said one of the processing results for producing the filter output in accordance with external phase-change information.

2. A running-average filter for producing a filter output by integrating an input digital signal in accordance with an integration phase and computing a running average of said input digital signal, said running-average filter comprising:

a filter processing unit for processing said input digital signal in a predetermined integration-phase state and producing a plurality of processing results;

a compensation circuit for acquiring, in response to a timing signal, compensation information representing a difference in magnitude between one of the processing results with an integration phase lagging behind or leading ahead of said predetermined integration-phase state and another of the processing results with an unchanged integration phase from a predetermined node of said filter processing unit with predetermined timing and supplying said compensation information to another predetermined node of said filter processing unit; and a control circuit for receiving external phase-change information indicating a leading-phase state and a lagging-phase state and, in accordance with said leading-phase and lagging-phase states, generating the timing signal for determining said predetermined timing.

3. A running-average filter according to claim 2, wherein said compensation circuit is a latch circuit latching the processing results in accordance with said timing signal.

4. Apparatus, comprising:
an oversampling-type A/D converter circuit for sampling an input analog signal in accordance with a predetermined sampling clock signal and converting said input analog signal into digital data;
a running-average filter for inputting said digital data, a filter processing unit for processing input digital data in a predetermined integration-phase state and producing a plurality of processing results, a compensation circuit for receiving the processing results an computing a difference in magnitude between one of the processing results with an integration phase lagging behind or leading ahead of said predetermined integration-phase state and another of the processing results with an unchanged integration phase, and an adder for selectively adding said difference to said one of the processing results for producing a filter output in accordance with external phase-change information; and
a digital phase locked loop circuit for synchronizing a phase of said sampling clock signal with a phase of the processing results and generating the external phase-change information supplied to said running-average filter based on said processing results produced by said running-average filter.

5. The apparatus according to claim 4, in a subscriber-line transmission apparatus of an integrated service digital network.

6. A filter which receives a plurality of input signals in a serial manner and which provides an output signal in accordance with the plurality of input signals, comprising:
filter processing means for providing a first output and a second output on a first timing and a second timing in accordance with a plurality of first ones and second ones of the input signals respectively, in a serial manner, the second timing being a different timing from the first timing;
compensation means coupled to said filter processing means for providing a difference between the first output and the second output; and
addition means, coupled to said filter processing means and to said compensation means, and for selectively adding the difference from said compensation means to the first output in response to an information.

7. The filter according to claim 6, coupled to an oversampling-type analog-digital converter, wherein the oversampling-type analog-digital converter provides an output of the input signals with a predetermined period.

8. The filter according to claim 7, wherein a time difference between said first timing and said second timing is said predetermined period.

9. The filter according to claim 8, wherein said second timing is one of a timing lagging behind said first timing and a timing leading ahead of said first timing.

10. The filter according to claim 9, further comprising a digital phase locked loop circuit outputting the information; and wherein said compensation means selectively outputs one of the first output and the second output under control of the digital phase locked loop circuit.

11. The filter according to claim 10, constituting a subscriber-line transmission apparatus including the oversampling-type analog-digital converter that receives input from a telephone line and outputs the input signals.

12. The filter according to claim 11, wherein said compensation means includes a latch circuit.

13. The filter according to claim 6, wherein said second timing is one of a timing lagging behind said first timing and a timing leading ahead of said first timing.

14. The filter according to claim 6, further comprising a digital phase locked loop circuit outputting the information; and wherein said compensation means selectively outputs one of the first output and the second output under control of the digital phase locked loop circuit.

15. The filter according to claim 6, constituting a subscriber-line transmission apparatus including an oversampling-type analog-digital converter that receives input from a telephone line and outputs the input signals.

16. The filter according to claim 6, wherein said compensation means includes a latch circuit.

* * * * *